US010162325B2

United States Patent
Burns et al.

(10) Patent No.: US 10,162,325 B2
(45) Date of Patent: *Dec. 25, 2018

(54) APPLICATION OF STRESS CONDITIONS FOR HOMOGENIZATION OF STRESS SAMPLES IN SEMICONDUCTOR PRODUCT ACCELERATION STUDIES

(71) Applicant: International Business Machines Corporation, Armonk, NY (US)

(72) Inventors: Mark A. Burns, Essex Junction, VT (US); Douglas S. Dewey, Highgate, VT (US); Nazmul Habib, South Burlington, VT (US); Daniel D. Reinhardt, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 67 days.

This patent is subject to a terminal disclaimer.

(21) Appl. No.: 15/289,215

(22) Filed: Oct. 10, 2016

(65) Prior Publication Data

US 2017/0023924 A1 Jan. 26, 2017

Related U.S. Application Data

(63) Continuation of application No. 15/284,570, filed on Oct. 4, 2016, which is a continuation of application (Continued)

(51) Int. Cl.
*G05B 19/042* (2006.01)
*G01R 31/28* (2006.01)
(Continued)

(52) U.S. Cl.
CPC ..... *G05B 19/0428* (2013.01); *G01R 31/2856* (2013.01); *G01R 31/2875* (2013.01);
(Continued)

(58) Field of Classification Search
USPC ............................................ 324/73.1, 750.03
See application file for complete search history.

(56) References Cited

U.S. PATENT DOCUMENTS 5,604,445 A  2/1997 Desai et al.
5,625,288 A  4/1997 Snyder et al.
(Continued)

FOREIGN PATENT DOCUMENTS

WO    2008044183 A2    4/2008

OTHER PUBLICATIONS

Pending U.S. Appl. No. 15/284,570, filed Oct. 4, 2016, entitled: "Application of Stress Conditions for Homogenization of Stress Samples in Semiconductor Product Acceleration Studies", 41 pages.

*Primary Examiner* — Lam Nguyen
(74) *Attorney, Agent, or Firm* — Michael O'Keefe

(57) ABSTRACT

A method for applying stress conditions to integrated circuit device samples during accelerated stress testing may include partitioning each of the integrated circuit device samples into a first region having a first functional element, partitioning each of the integrated circuit device samples into at least one second region having at least one second functional element, applying a first stress condition to the first region having the first element, applying a second stress condition to the at least one second region having the at least one second element, determining a first portion of the integrated circuit device samples that functionally failed based on the first stress condition, and determining a second portion of the integrated circuit device samples that functionally failed based on the second stress condition. An acceleration model parameter is derived based on the determining of the first and second portion of the integrated circuit samples that functionally failed.

20 Claims, 10 Drawing Sheets

Related U.S. Application Data

No. 14/196,009, filed on Mar. 4, 2014, now Pat. No. 9,506,977.

(51) Int. Cl.
  *G05B 17/02* (2006.01)
  *H01L 21/66* (2006.01)

(52) U.S. Cl.
  CPC .... *G05B 17/02* (2013.01); *G05B 2219/45031* (2013.01); *H01L 22/30* (2013.01)

(56) References Cited

U.S. PATENT DOCUMENTS

| | | |
|---|---|---|
| 5,982,189 A | 11/1999 | Motika et al. |
| 5,994,910 A | 11/1999 | Downes, Jr. et al. |
| 7,292,058 B2 | 11/2007 | Anderson et al. |
| 7,472,038 B2 | 12/2008 | Bose et al. |
| 7,512,506 B2 | 3/2009 | Aubel et al. |
| 8,237,458 B2 | 8/2012 | Federspiel |
| 8,907,687 B2 | 12/2014 | McMahon et al. |
| 2003/0001604 A1 | 1/2003 | Pullen et al. |
| 2003/0030460 A1 | 2/2003 | Bernstein et al. |
| 2006/0158222 A1 | 7/2006 | Gattiker et al. |
| 2008/0297188 A1 | 12/2008 | Aubel et al. |
| 2009/0058443 A1 | 3/2009 | Ohashi et al. |
| 2012/0249176 A1 | 10/2012 | Chien et al. |
| 2015/0253376 A1 | 9/2015 | Burns et al. |

APPLICATION OF STRESS CONDITIONS FOR HOMOGENIZATION OF STRESS SAMPLES IN SEMICONDUCTOR PRODUCT ACCELERATION STUDIES

BACKGROUND

The present invention generally relates to semiconductor device testing, and more particularly, to semiconductor accelerated stress testing.

During semiconductor accelerated stress testing and evaluation, when trying to compare two or more different stress results, variation within a sample population (e.g., single chip devices on the wafer or from differing wafers) can cause errors in interpreting the result. This variation may originate from multiple sources such as, but not limited to, wafer to wafer variability, wafer regionality, intentional process variation across the wafer, and any combination thereof.

Generally, defects within a wafer or between wafers may not be uniformly distributed. Thus, the interpreted results of the stress test may inadvertently depend to a certain degree on semiconductor wafer defects that may vary based on, for example, the location of the chip within a given wafer. The abovementioned affects may be exacerbated when yields per wafer are low, or when evaluating complex structures such as multichip modules, 3D stacked chips, etc., where chip parentage is more likely to differ.

For example, referring to FIG. 1A, in conventional stress testing, a number of sample chip devices, as denoted by cp, within a wafer 104 may be stressed as devices or after packaging (i.e., BAT device samples: Bonded Assembled and Tested device samples) under different stress conditions. For example, chip devices undergoing thermal stressing may be subjected to both a lower stress temperature condition and a higher stress temperature condition. As depicted, chip devices undergoing the lower stress temperature condition are identified by character A, while chip devices undergoing the higher stress temperature condition are indicated by character B.

Referring to FIG. 1B, the characteristics of wafer 104 may, for example, vary across the wafer 104, as indicated by 105a; vary according to regionality of the wafer 104, as indicated by 105b; or vary based on intentional process variations across the wafer 104, as indicated by 105c.

Referring to FIGS. 1A and 1B, for example, chip 106 within wafer 104 may undergo stress condition A while chip 108 within wafer 104 may undergo stress condition B. However, due to variability across the wafer 104, as indicated at 110, the results of the applied stress to chips 106 and 108 may be influenced by the wafer variability as opposed to the response of the chip devices to applied stress conditions A and B. In another example, chip 106 within wafer 104 may undergo stress condition A while chip 108 within wafer 104 may undergo stress condition B. However, due to wafer variability at regions $R_1$ and $R_2$ of wafer 104, the results of the applied stress to chips 106 and 108 may be influenced by each chip 106, 108 being located in a different region $R_1$, $R_2$ rather than based on the response of the chip devices to applied stress conditions A and B. Similarly, wafer variability may be intentionally introduced at regions $P_1$-$P_5$ of wafer 104. This may occur as a result intentional process variations (e.g., regional doping) introduced at different regions $P_1$-$P_5$ across the wafer 104. For example, the applied stress conditions to chips 106 and 108 may be influenced by each chip 106, 108 being located in respective regions $P_5$ and $P_4$ rather than by the response of the chip devices to applied stress conditions A and B.

Thus, such variations may require an increased time and/or process overhead associated with selecting stress samples that are as homogenous as possible. Such challenges may become further exacerbated when the test samples (i.e., BAT device samples: Bonded Assembled and Tested device samples) include 3D stacked chip devices that may include semiconductor stacked layers having different wafer parentage.

SUMMARY

According to an exemplary embodiment, a method for applying stress conditions to integrated circuit device samples during accelerated stress testing is provided. The method may include partitioning each of the integrated circuit device samples into a first region having a first functional element, and partitioning each of the integrated circuit device samples into at least one second region having at least one second functional element. A first stress condition is applied to the first region having the first functional element, while a second stress condition is applied to the at least one second region having the at least one second functional element. A first portion of the integrated circuit device samples that have functionally failed are determined based on the applying of the first stress condition, while a second portion of the integrated circuit device samples that have functionally failed are determined based on the applying of the second stress condition. An acceleration model parameter is then derived based on the determining of the first and the second portion of the integrated circuit device samples that have functionally failed.

According to another exemplary embodiment, a computer system for applying stress conditions to integrated circuit device samples during accelerated stress testing may include a memory and a processor in communication with the memory, whereby the processor has an instruction fetching unit for fetching instructions from memory and one or more execution units for executing the fetched instructions. The computer system is capable of performing a method that may include partitioning each of the integrated circuit device samples into a first region having a first functional element, and partitioning each of the integrated circuit device samples into at least one second region having at least one second functional element. A first stress condition is applied to the first region having the first functional element, while a second stress condition is applied to the at least one second region having the at least one second functional element. A first portion of the integrated circuit device samples that have functionally failed are determined based on the applying of the first stress condition, while a second portion of the integrated circuit device samples that have functionally failed are determined based on the applying of the second stress condition. An acceleration model parameter is then derived based on the determining of the first and the second portion of the integrated circuit device samples that have functionally failed.

According to yet another exemplary embodiment, a computer program product for applying stress conditions to integrated circuit device samples during accelerated stress testing may include one or more computer-readable storage devices and program instructions stored on at least one of the one or more tangible storage devices, whereby the program instructions are executable by a processor. The program instructions may include partitioning each of the integrated circuit device samples into a first region having a first functional element and partitioning each of the integrated circuit device samples into at least one second region having a at least one second functional element. A first stress condition is applied to the first region having the first functional element, while a second stress condition is applied to the at least one second region having the at least one second functional element. A first portion of the integrated circuit device samples that have functionally failed are determined based on the applying of the first stress condition. A second portion of the integrated circuit device samples that have functionally failed are determined based on the applying of the second stress condition. An acceleration model parameter is then derived based on the determining of the first and the second portion of the integrated circuit device samples that have functionally failed.

BRIEF DESCRIPTION OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
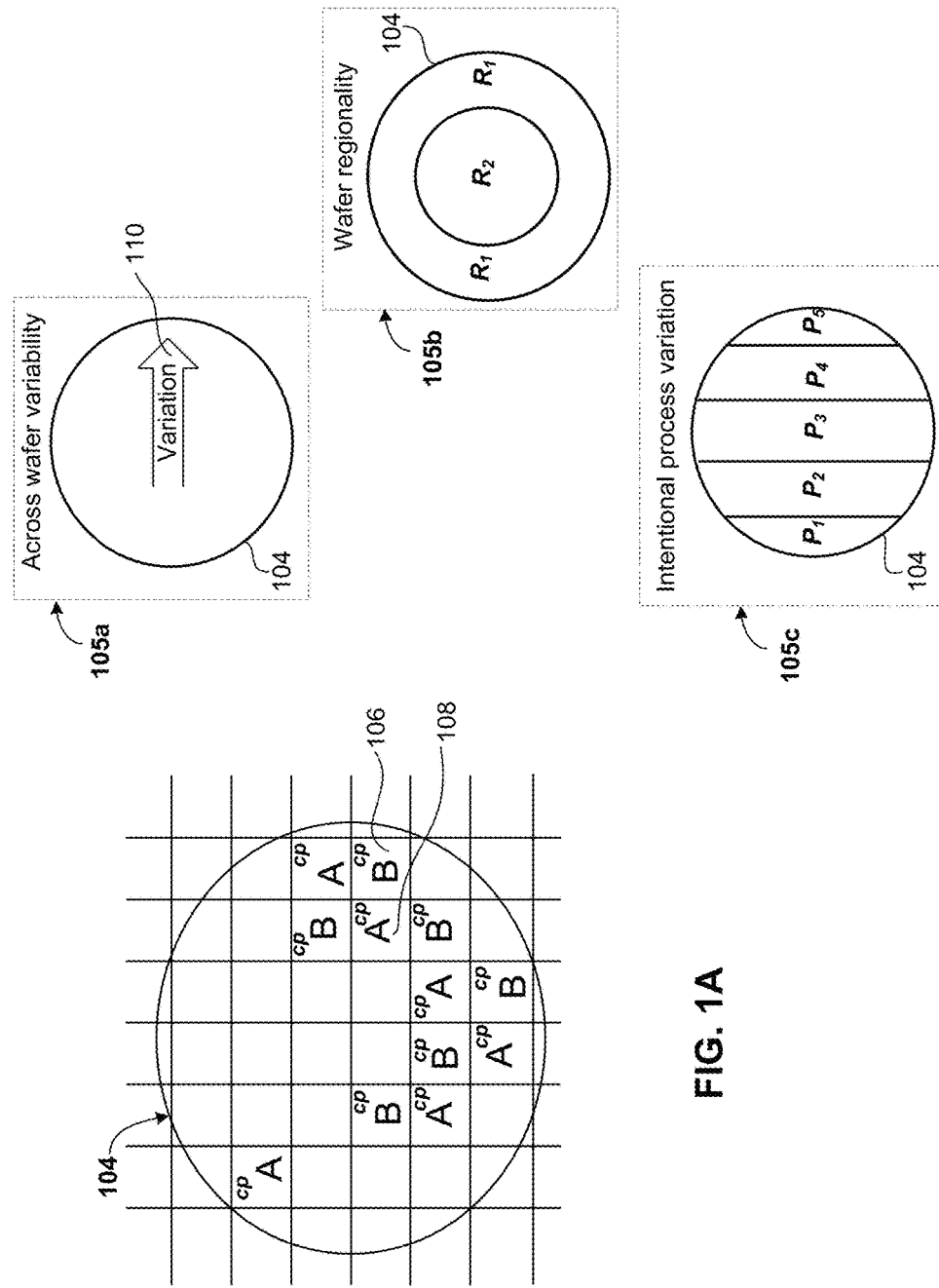
FIG. 1A and FIG. 1B depict a conventional stress acceleration methodology associated with chip devices on a semiconductor wafer.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
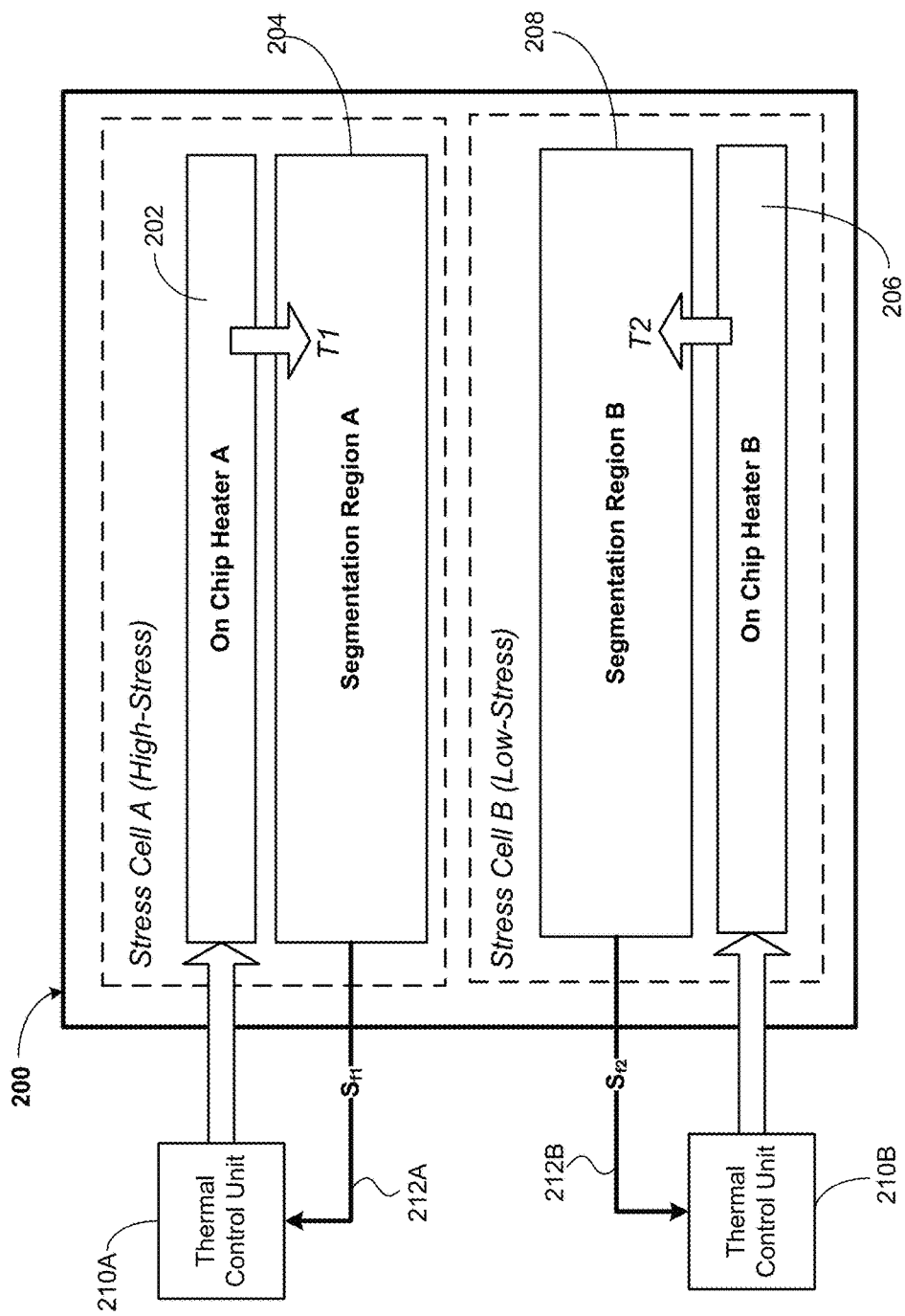
FIG. 2 depicts a chip device that incorporates thermal stress conditions for acceleration testing according to an embodiment.

FIG. 2 depicts a chip device 200 that incorporates thermal stress conditions for acceleration testing according to one exemplary embodiment. As illustrated, the chip device 200 may include an integrated circuit having a first on-chip heater device 202 for controllably providing heat to a first partitioned or segmented region 204. Similarly, the integrated circuit of chip device 200 may also include a second on-chip heater device 206 for controllably providing heat to a second partitioned or segmented region 208.

Still referring to FIG. 2, a first thermal control unit 210A controls the amount of heat generated by on-chip heater device 202. According to one exemplary implementation, the on-chip heater device 202 may include a resistive element (i.e., resistor device). The first thermal control unit 210A may apply a predetermined voltage across the resistive element (i.e., resistor device) causing current to flow through the resistive element (i.e., resistor device). As current flows through the resistive element (i.e., resistor device), the resistive element (i.e., resistor device) dissipates heat, which is conductively transferred, as indicated by Arrow T1, to partitioned or segmented region 204. A feedback path 212A between partitioned or segmented region 204 and the thermal control unit 210A may facilitate maintaining partitioned or segmented region 204 at a predetermined stress condition temperature (e.g., 140° C.). For example, feedback path 212A may provide a signal $S_{fl}$ that is indicative of the temperature of the partitioned or segmented region 204 to the thermal control unit 210A.

Similarly, a second thermal control unit 210B controls the amount of heat generated by on-chip heater device 206. According to one exemplary implementation, the on-chip heater device 206 may include a resistive element (i.e., resistor device). The second thermal control unit 210B may apply another predetermined voltage across the resistive element (i.e., resistor device) causing current to flow through the resistive element (i.e., resistor device). As current flows through the resistive element (i.e., resistor device), the resistive element (i.e., resistor device) dissipates heat, which is conductively transferred, as indicated by Arrow T2, to partitioned or segmented region 208. A feedback path 212B between partitioned or segmented region 208 and the thermal control unit 210B may facilitate maintaining partitioned or segmented region 208 at another predetermined stress condition temperature (e.g., 100° C.). For example, feedback path 212B may provide a signal Sp that is indicative of the temperature of the partitioned or segmented region 208 to the thermal control unit 210B.

As illustrated and described in relation to FIG. 2, the integrated circuit within chip device 200 may be segmented or partitioned into two functional elements. For example, a block of 1 Gb SRAM cells may be segmented or partitioned into a first 100 Mb region corresponding to region 204 and a second 900 Mb region corresponding to region 208. Thus, a first stress condition having a higher temperature (e.g., 140° C.) may be applied to the first 100 Mb region corresponding to region 204 using thermal control unit 210A. A second stress condition having a lower temperature (e.g., 100° C.) may be applied to the second 900 Mb region corresponding to region 208 using thermal control unit 210B.

According to another example, a multi-core (e.g., 4-cores) processor may be segmented or partitioned into a single (i.e., 1 core) core region corresponding to region 204 and a multi-core region (i.e., 3 cores) corresponding to region 208. Thus, a first stress condition having a higher temperature (e.g., 140° C.) may be applied to the single core region corresponding to region 204 using thermal control unit 210A, while a second stress condition having a lower temperature (e.g., 100° C.) may be applied to the multi-core region corresponding to region 208 using thermal control unit 210B. It may be appreciated that in some implementations, however, multiple stress conditions may be applied to multiple segmented functional regions. For example, in such an implementation, a first stress condition (e.g., 100° C.) may be applied to a first core of a multi-core (e.g., 4-cores) processor device, a second stress condition (e.g., 120° C.) may be applied to a second core of the multi-core (e.g., 4-cores) processor device, a third stress condition (e.g., 140° C.) may be applied to a third core of the multi-core (e.g., 4-cores) processor device, and a fourth stress condition (e.g., 155° C.) may be applied to a fourth core of the multi-core (e.g., 4-cores) processor device.

Referring still to FIG. 2, measures may be taken to reduce the effect of each on-chip heater on the other partitioned or segmented region. As depicted, on-chip heater 202 provides heat to partitioned or segmented region 204, while on-chip heater 206 provides heat to partitioned or segmented region 208. However, measures may be taken to remove or reduce the heating effect of on-chip heater 202 on partitioned or segmented region 208. Similarly, measures may be taken to remove or reduce the heating effect of on-chip heater 206 on partitioned or segmented region 204. Some exemplary measures may include providing thermal isolation regions between Stress Cell A and Stress Cell B. As illustrated, Stress Cell A may include the on-chip heater 202 and the partitioned or segmented region 204 receiving the stress condition applied by the on-chip heater 202. Also, Stress Cell B may include the on-chip heater 206 and the partitioned or segmented region 208 receiving the stress condition applied by the on-chip heater 206.

Figure 3:
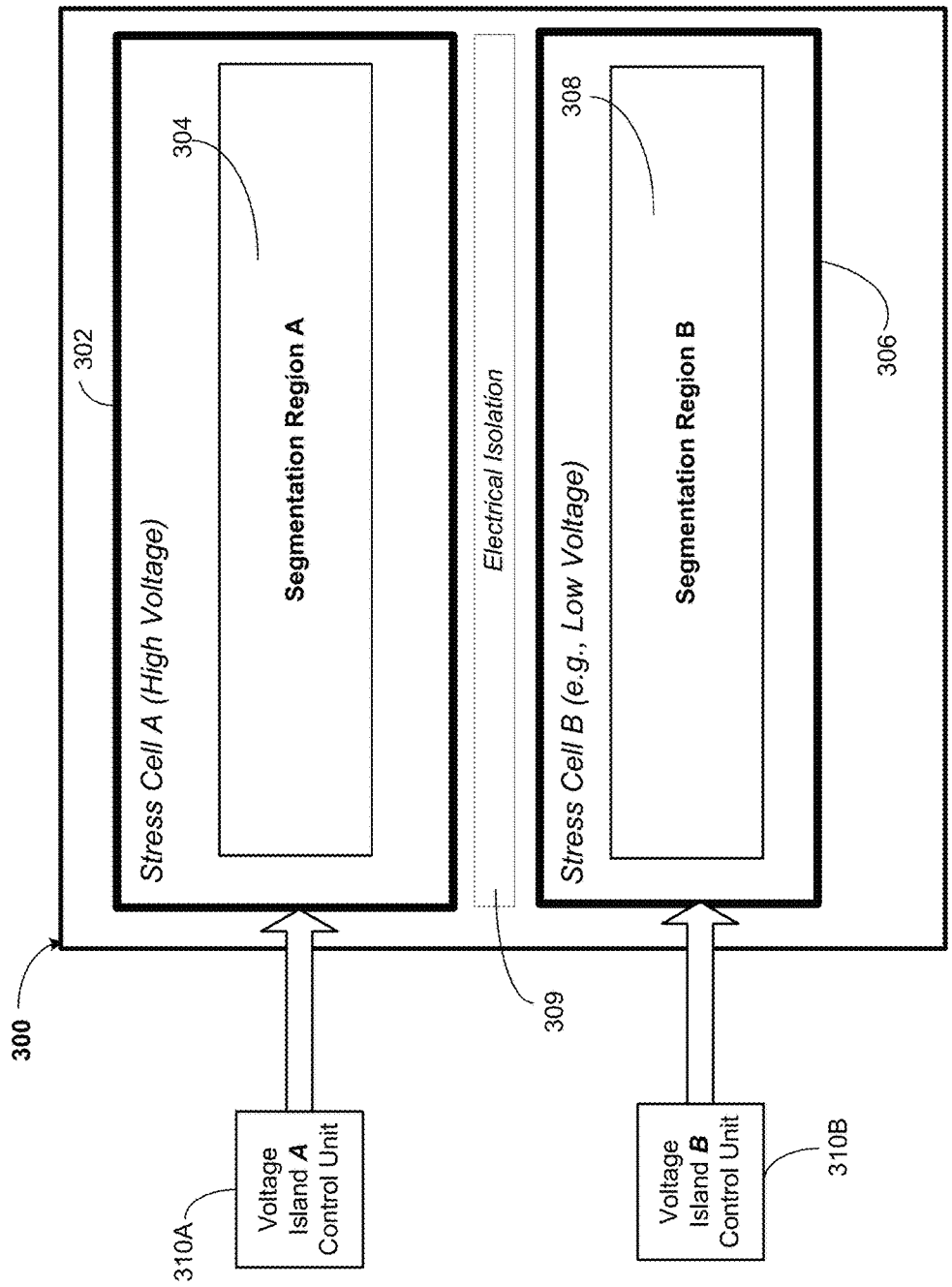
FIG. 3 depicts a chip device that incorporates applying voltage stress conditions for acceleration testing according to another embodiment.

FIG. 3 depicts a chip device 300 that incorporates voltage stress conditions for acceleration testing according to one exemplary embodiment. As illustrated, the chip device 300 may include an integrated circuit having a first voltage island 302 for controllably providing a first supply voltage to a first partitioned or segmented region 304. Similarly, the integrated circuit of chip device 300 may also include a second voltage island 306 for controllably providing a second supply voltage to a second partitioned or segmented region 308.

Still referring to FIG. 3, a first voltage island control unit 310A controls the amount of voltage that is supplied to the first partitioned or segmented region 304. According to one exemplary implementation, the first voltage island 302 may include a region of the chip device 300 that includes the first partitioned or segmented region 304 and receives an independent supply voltage that is controllable by the first voltage island control unit 310A. Similarly, a second voltage island control unit 310B controls the amount of voltage that is supplied to the second partitioned or segmented region 308. According to one exemplary implementation, the second voltage island 306 may include a region of the chip device 300 that includes the second partitioned or segmented region 308 and receives another independent supply voltage that is controllable by the second voltage island control unit 310B. As depicted, the first and the second partitioned or segmented regions 304, 308 may be electrically isolated by, for example, one or more electrical isolation regions 309, which, therefore, avoids the first and the second voltage islands 302, 306 from electrically interfering with each other.

As illustrated and described in relation to FIG. 3, the integrated circuit within chip device 300 may be segmented or partitioned into two functional elements. For example, a block of 1 Gb SRAM cells may be segmented or partitioned into a first 100 Mb region corresponding to region 304 and a second 900 Mb region corresponding to region 308. Thus, a first stress condition having a higher voltage (e.g., 2V) may be applied to the first 100 Mb region corresponding to region 304 using voltage island control unit 310A. A second stress condition having a lower voltage (e.g., 1V) may be applied to the second 900 Mb region corresponding to region 308 using voltage island control unit 310B.

According to another example, a multi-core (e.g., 4-cores) processor may be segmented or partitioned into a single (i.e., 1 core) core region corresponding to region 304 and a multi-core region (i.e., 3 cores) corresponding to region 308. Thus, a first stress condition having a higher voltage (e.g., 2V) may be applied to the single core region corresponding to region 304 using voltage island control unit 310A, while a second stress condition having a lower voltage (e.g., 1V) may be applied to the multi-core region corresponding to region 308 using voltage island control unit 310B. It may be appreciated that in some implementations, however, multiple stress conditions may be applied to multiple segmented functional regions. For example, in such an implementation, a first stress condition (e.g., 1V) may be applied to a first core of a multi-core (e.g., 4-cores) processor device, a second stress condition (e.g., 1.5V) may be applied to a second core of the multi-core (e.g., 4-cores) processor device, a third stress condition (e.g., 2V) may be applied to a third core of the multi-core (e.g., 4-cores) processor device, and a fourth stress condition (e.g., 2.5V) may be applied to a fourth core of the multi-core (e.g., 4-cores) processor device.

Referring still to FIG. 3, measures may be taken to reduce the effect of each applied stress voltage on the other partitioned or segmented region. As depicted, voltage island control unit 310A may provide a higher stress inducing supply voltage to partitioned or segmented region 304, while voltage island control unit 310B may provide a lower stress inducing supply voltage to partitioned or segmented region 308. However, measures may be taken to electrically isolate the partitioned or segmented regions 304, 308. Some exemplary measures may include providing an electrical isolation region 309 between Stress Cell A and Stress Cell B. As illustrated, Stress Cell A may include the partitioned or segmented region 304 that receives the voltage stress condition applied within voltage island 302. Also, Stress Cell B may include the partitioned or segmented region 308 that receives the voltage stress condition applied within voltage island 306.

According to the one or more advantages of the described exemplary embodiments of FIGS. 2 and 3, the application of the different stress conditions (e.g., higher and lower stress conditions) localized within each chip device mitigates factors associated chip device failures influenced by defects in the wafers. As described in relation with FIGS. 1A-1B, during accelerated stress testing, device failure and fallout percentages may result, to some extent, from defects across the wafer or between wafers having different parentage (e.g., within 3D integrated devices). However, according to the exemplary embodiments described and illustrated herein, different stress conditions are applied to partitioned functional elements within the chip, which in turn mitigates or removes the influence of defects or characteristic variations posed across the wafer. Thus, the localized conditions that are applied to the partitioned functional elements within the chip establish a measure of device failures that depend on the stressed integrated circuit devices (e.g., a processor core) formed on chip and not as a result of variations associated with the wafer from which the chip device is created.

Figure 4:
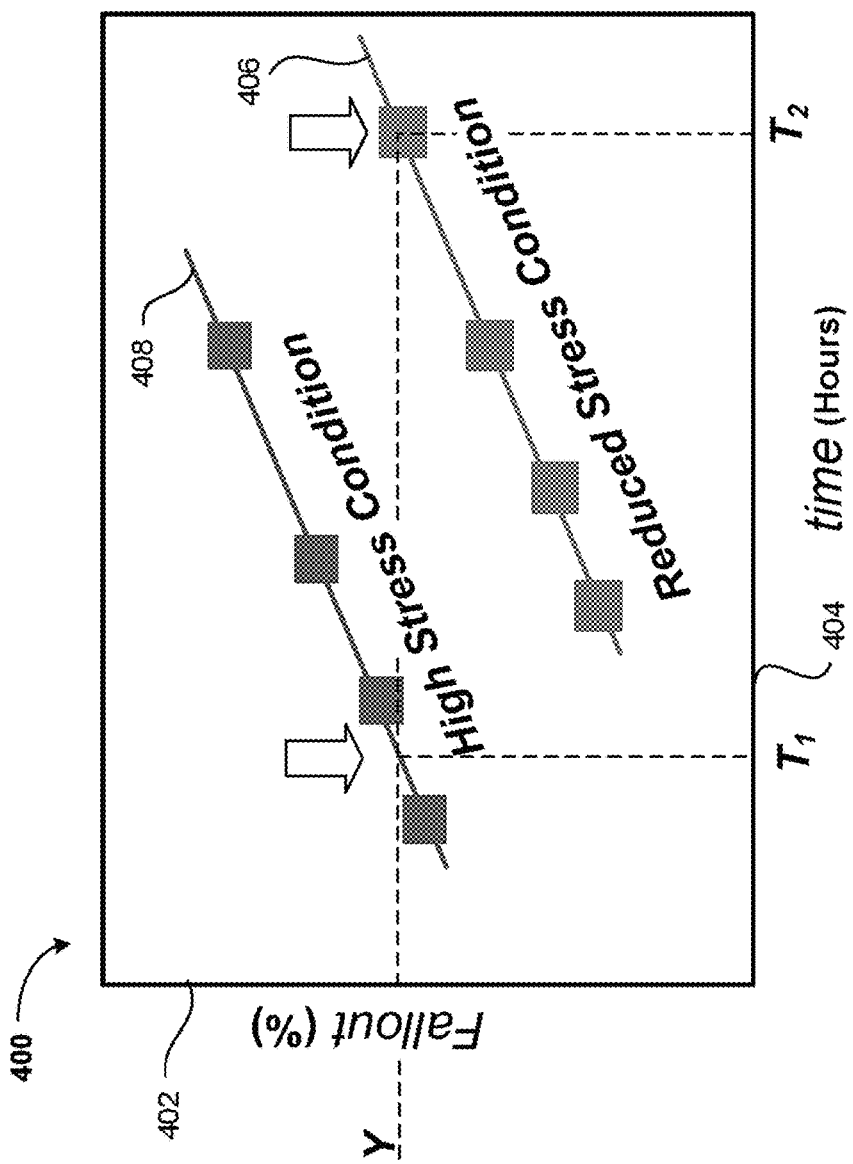
FIG. 4 illustrates an exemplary empirical graph of device fallout versus time for applied stress conditions according to an embodiment.

FIG. 4 illustrates an exemplary empirical graph 400 of device fallout versus time for applied stress conditions according to an embodiment. As depicted, the y-axis 402 of the graph 400 corresponds to a percentage (%) of device fallout (i.e., failed devices), while the x-axis 404 of the graph 400 corresponds to the passage of time (t). The percentage (%) of device fallout may be associated with the number of packaged devices that operationally fail under test when a stress condition is applied. As shown, positive ramp 406 illustrates a linearized relationship between the device fallout with the increased passage of time, based on the application of a reduced or lower stress condition. Similarly, positive ramp 408 illustrates a linearized relationship between device fallout with the increased passage of time, based on the application of an increased or high stress condition.

For example, a device fallout of about 50%, as indicated by Y, may occur at time $T_1$ under high stress conditions, whereby the device fallout of about 50% (Y) may occur at the later time of $T_2$ under reduced or lower stress conditions. Such data may, therefore, be utilized to empirically determine various constant values for use in acceleration models. One example of an acceleration model may include a mathematical relationship (e.g., Arrhenius model) that predicts the time-to-fail of a device as a function of an applied stress condition (e.g., temperature, voltage, etc.). For example, using the times $T_1$, $T_2$ for the 50% fallout rate (Y) based on the applied stress conditions (i.e., high and reduced stress conditions), a constant value for the acceleration model may be determined.

For example, for the Arrhenius equation given by:

$$AF = \exp\left(\frac{\Delta H}{k}\left[\frac{1}{T_1} - \frac{1}{T_2}\right]\right)$$

AF is the acceleration factor, k is the Boltzmann's constant, $T_1$ is the lower stress temperature, $T_2$ is higher stress temperature, and $\Delta H$ is the activation energy. For example, using the data associated with graph 400, the $\Delta H$ factor may be determined. Once the $\Delta H$ factor is ascertained empirically via graph 400, the acceleration factor AF can be predicted for different stress conditions (i.e., $T_1$ and $T_2$) using the acceleration model.

Figure 5A:
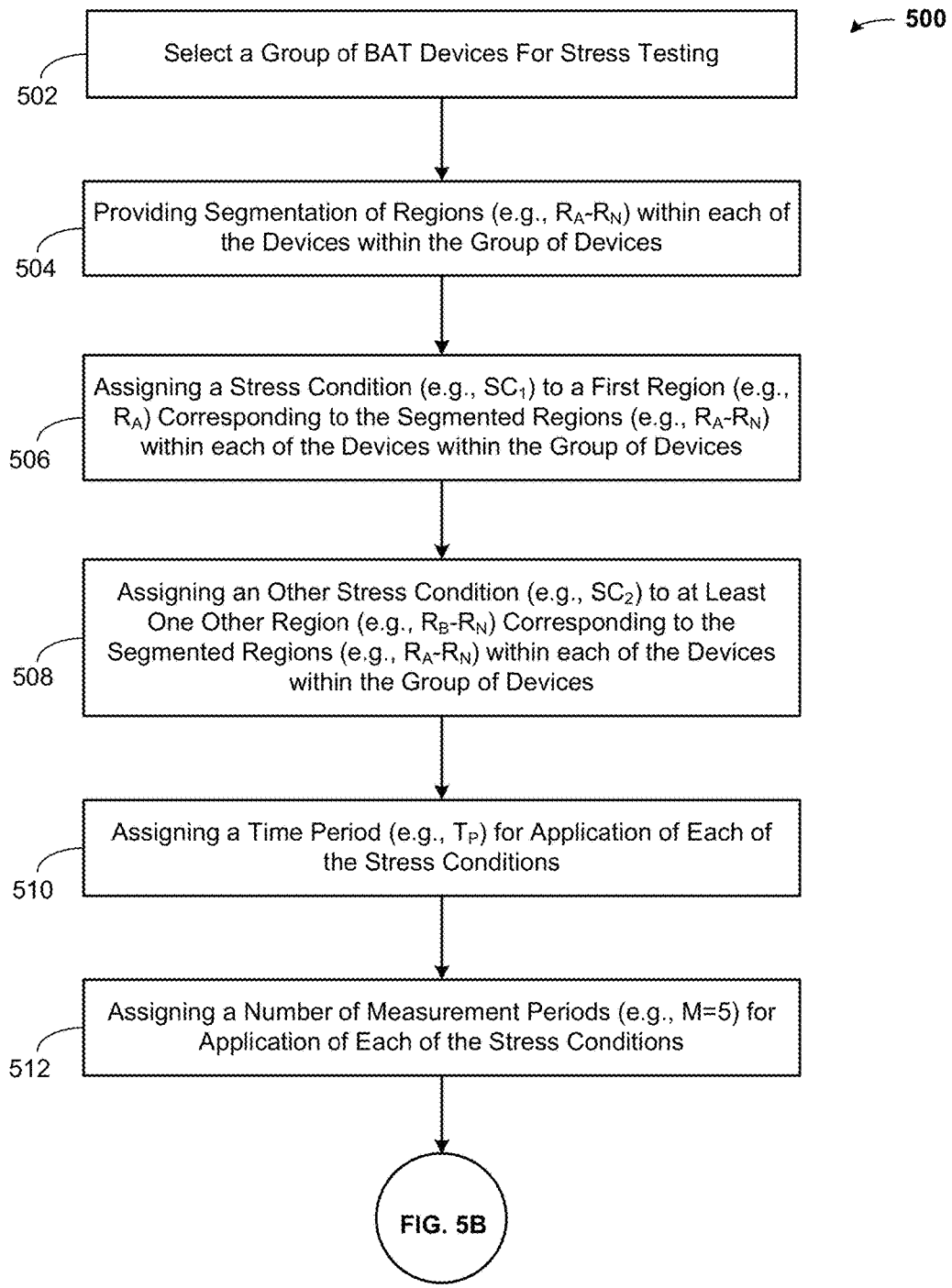
FIGS. 5A-5C depict a process flow diagram for applying homogenized acceleration stress testing according to an embodiment.
Figure 5B:
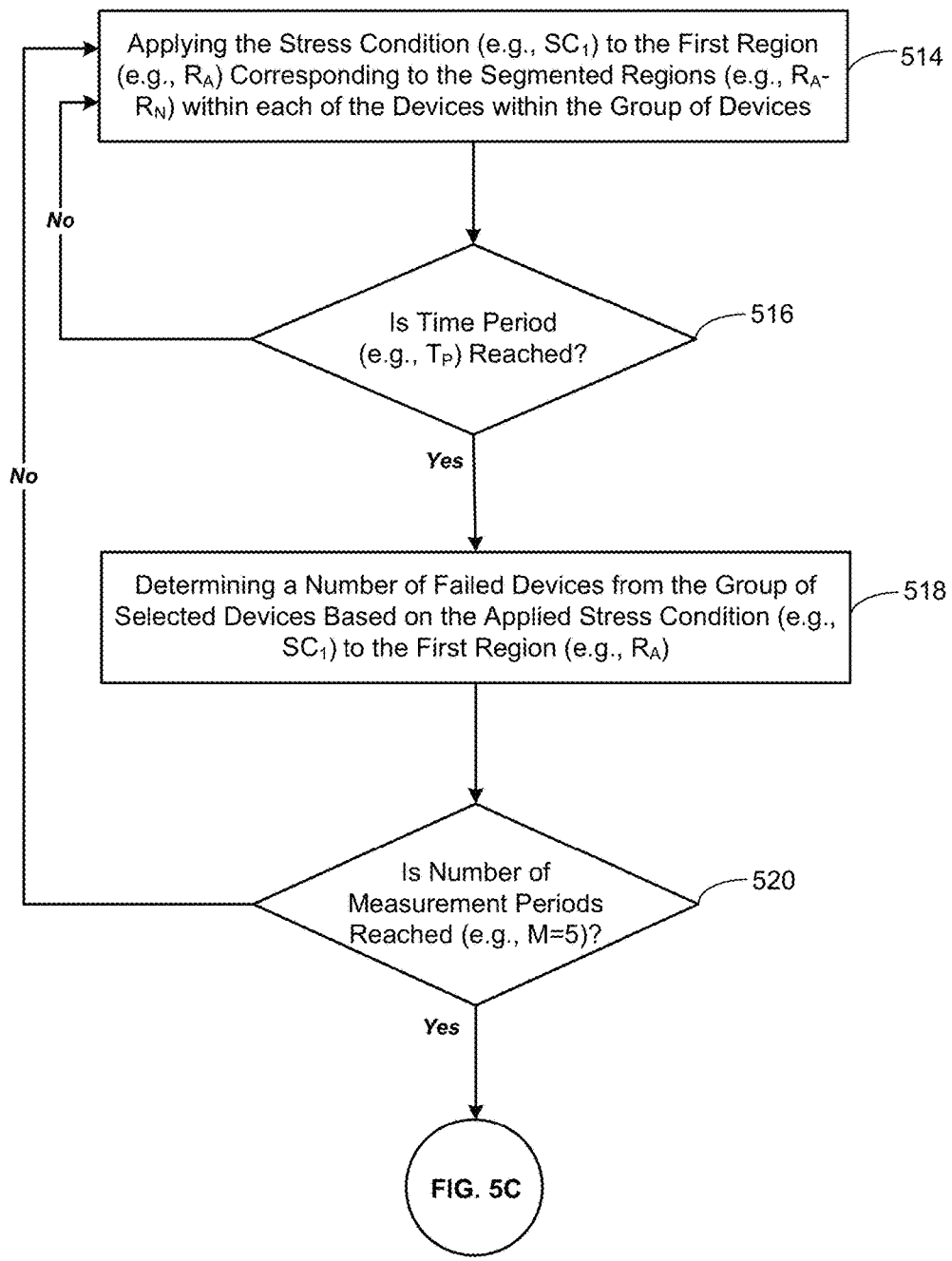
Figure 5C:
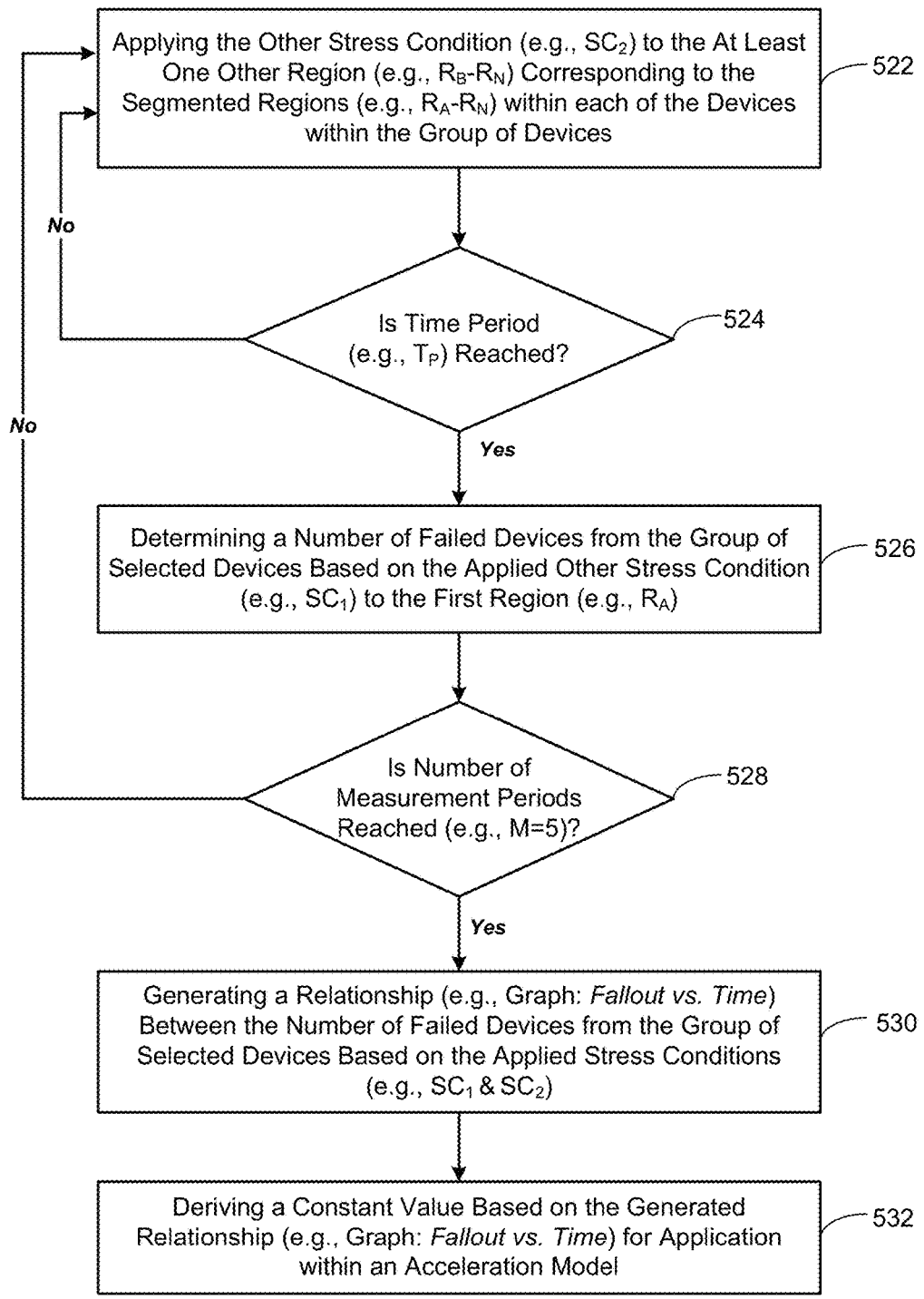

FIGS. 5A-5C depict a process flow diagram 500 for applying homogenized acceleration stress testing according to an embodiment. The process flow diagram 500 shown in FIGS. 5A-5C may be described with the aid of FIGS. 2-4.

Referring to FIG. 5A, at 502 a group (e.g., 100 devices) of bonded, assembled, and tested (BAT) devices are selected for stress testing. At 504, each of the groups of devices are partitioned or segmented into two or more regions based on having functional elements. For example, as depicted in FIG. 2, chip device 200 is segmented into two regions such as partitioned or segmented region 204 ($R_A$) and region 208 ($R_B$). Partitioned or segmented region 204 ($R_A$) may include one functional element (e.g., 100 Mb or SRAM memory) while partitioned or segmented region 208 ($R_B$) includes another functional element (e.g., 900 Mb or SRAM memory). Accordingly, each of the BAT group of devices may be partitioned in a similar manner. According to another example, as depicted in FIG. 3, chip device 300 is segmented into two regions such as partitioned or segmented region 304 ($R_A$) and region 308 ($R_B$). Partitioned or segmented region 304 ($R_A$) may include one functional element (e.g., one (1) core of a multi-core processor) while partitioned or segmented region 308 ($R_B$) includes another functional element (e.g., three (3) remaining cores of the multi-core processor). Accordingly, each of the BAT group of devices may be partitioned in a similar manner.

At 506, a first stress condition (e.g., a first stress temperature) is assigned for application to a first segmented or partitioned region within each of the group of devices. For example, as depicted in FIG. 2, a first higher stress temperature (e.g., 140° C.) may be assigned for application to partitioned or segmented region 204 ($R_A$) of chip device 200. At 508, a second stress condition (e.g., a second stress temperature) is assigned for application to at least one other segmented or partitioned region within each of the group of devices. For example, as depicted in FIG. 2, a second lower stress temperature (e.g., 100° C.) may be assigned for application to partitioned or segmented region 208 ($R_B$) of chip device 200.

According to yet another example, as depicted in FIG. 3, a first higher stress voltage (e.g., 2V) may be assigned for application to partitioned or segmented region 304 ($R_A$) of chip device 300 (process: 506). Similarly. a second lower stress voltage (e.g., 1V) may then be assigned for application to at least one other segmented or partitioned region such as partitioned or segmented region 308 ($R_B$) of chip device 300 (process: 508).

At 510, a time period ($T_p$) for application of the assigned stress conditions may be assigned or determined. For example, a $T_p$ value of 15-minutes may be assigned. According to yet another example, a $T_p$ value of 1-hour may be assigned. The assignment of a $T_p$ value may, among other things, be dependent on the stress conditions being applied and the sensitivity (e.g., fallout rate) of the devices under test to such stress conditions.

At 512, a number of measurement periods (M) for the application of the stress conditions may be assigned. For example, for M=5, five (5) fallout measurements are taken following each time period that the stress conditions are applied. More specifically, at M=1, fall out measurements are taken after the time period (e.g., $T_p$=15-minutes) passage (e.g., total passage of 15 minutes); at M=2, fall out measurements are taken after another time period (e.g., T=15-minutes) passage (e.g., total passage of 30 minutes); at M=3, fall out measurements are taken again after the time period (e.g., $T_p$=15-minutes) passage (e.g., total passage of 45 minutes); at M=4, fall out measurements are taken after the time period (e.g., $T_p$=15-minutes) passage (e.g., total passage of 60 minutes); and finally at M=5, fall out measurements are taken yet again after the time period (e.g., $T_p$=15-minutes) passage (e.g., total passage of 75 minutes). The application of the assigned time period and measurement period are further described below in relation to FIG. 5B.

Referring now to FIG. 5B, at 514, the first assigned stress condition (e.g., a first stress temperature) is applied to the first segmented or partitioned region within each of the group of devices. For example, as depicted in FIG. 2, the first stress temperature (e.g., 140° C.) may be applied to partitioned or segmented region 204 ($R_A$) of chip device 200. According to yet another example, as depicted in FIG. 3, the first stress voltage (e.g., 2V) may be applied to partitioned or segmented region 304 ($R_A$) of chip device 300.

At 516, it is determined whether the time period $T_p$ has been reached. If the time period $T_p$ has not been reached, the process returns to 514, whereby the first assigned stress condition (e.g., a first stress temperature or voltage) continues to be applied to the first segmented or partitioned region within each of the group of devices. Alternatively, if the time period $T_p$ has been reached, at 518 the number of failed devices (e.g., fallout percentage) from the group of selected BAT devices is determined based on the applied first assigned stress condition.

At 520, following the determining of the number of failed devices (e.g., fallout percentage) from the group of selected BAT devices (518), it is determined whether the number of assigned measurement periods (e.g., M=5) has been reached. If the number of assigned measurement periods (e.g., M=5) has not been reached (e.g. M=1, 2, 3, or 4), processes 514-520 are repeated in the manner described above.

If the number of assigned measurement periods (e.g., M=5) has been reached (e.g. M=5), referring to FIG. 5C, at 522 the second stress condition (e.g., a second stress temperature) is applied to at least one other segmented or partitioned region within each of the group of devices. For example, as depicted in FIG. 2, the second lower stress temperature (e.g., 100° C.) may be applied to partitioned or segmented region 208 ($R_B$) of chip device 200. Similarly, according to another example, a second lower stress voltage (e.g., 1V) may be applied to at least one other segmented or partitioned region such as partitioned or segmented region 308 ($R_B$) of chip device 300.

At 524, it is determined whether the assigned time period $T_p$ has been reached. If the time period $T_p$ has not been reached, the process returns to 522, whereby the second assigned stress condition (e.g., a second stress temperature or voltage) continues to be applied to the at least one second segmented or partitioned region within each of the group of devices. Alternatively, if the time period $T_p$ has been reached, at 526 the number of failed devices (e.g., fallout percentage) from the group of selected BAT devices is determined based on the applied second assigned stress condition.

At 528, following the determining of the number of failed devices (e.g., fallout percentage) from the group of selected BAT devices (526), it is determined whether the number of assigned measurement periods (e.g., M=5) has been reached. If the number of assigned measurement periods (e.g., M=5) has not been reached (e.g. M=1, 2, 3, or 4), processes 522-528 are repeated in the manner described.

If the number of assigned measurement periods (e.g., M=5) has been reached (e.g. M=5), at 530 a relationship such as the graph of Fallout vs. Time depicted in FIG. 4 may be generated based on the number of empirically determined failed devices subjected to the stress conditions. For example, the time line (i.e., x-axis) for the determined number of device failures may be derived from the assigned time period ($T_p$) and measurement period (M).

At 532, using the empirically determined relationship between device failures and the applied stress conditions (e.g., temperature, voltage, etc.), a constant value may be determined for application within a designated acceleration model. Referring back to FIG. 4, one non-limiting example for determining a constant value for an acceleration model based on empirical fallout data was provided. Using the embodiment described herein, device failures are predominantly a factor of the assigned stress conditions that are applied and, therefore, have little to no dependency on wafer defect variability. Thus, the calculated constants used in the acceleration models are able to more accurately predict device failures based on assigned stress conditions.

Figure 6A:
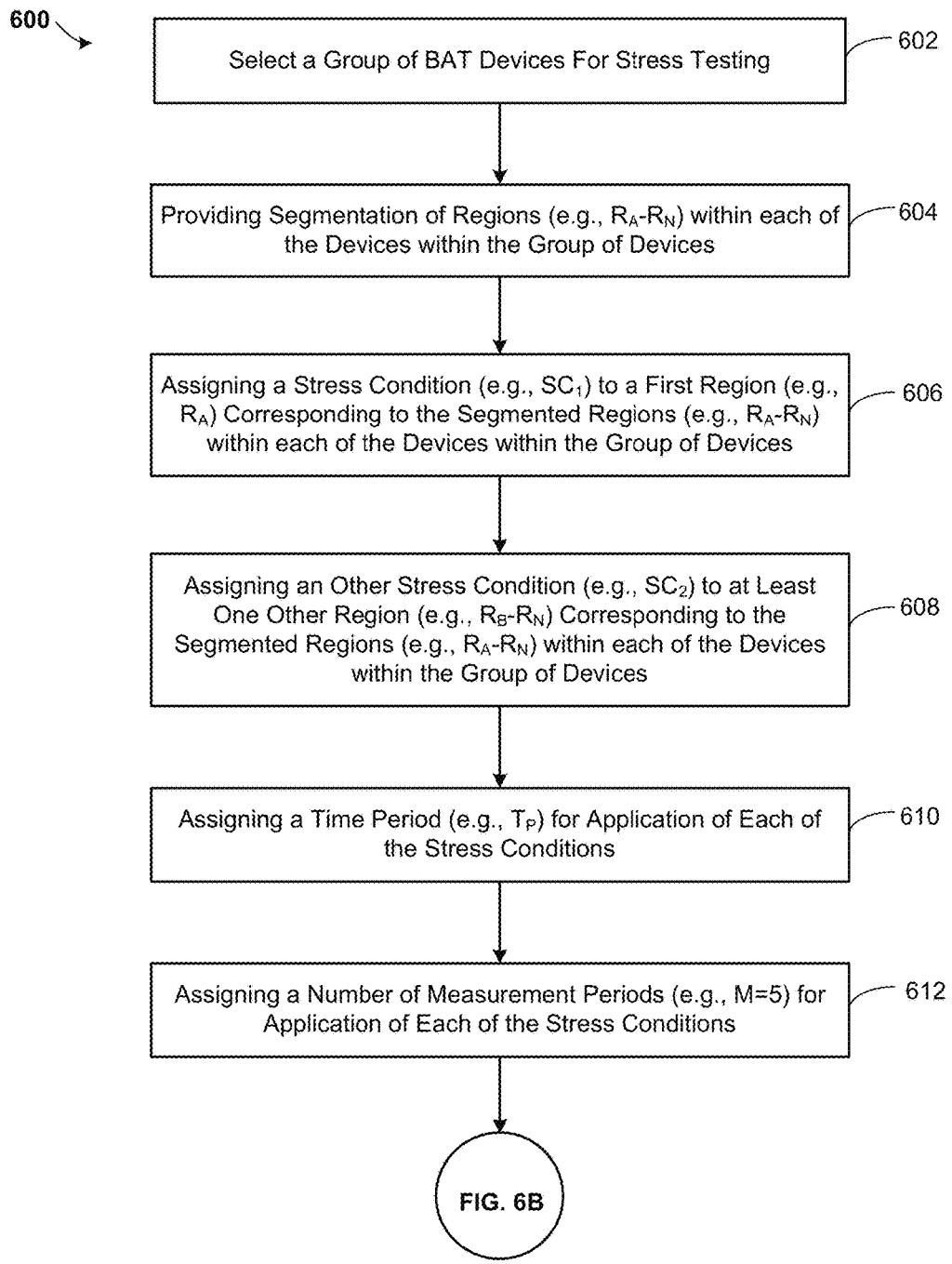
FIGS. 6A-6B depict a process flow diagram for applying homogenized acceleration stress testing according to another embodiment.
Figure 6B:
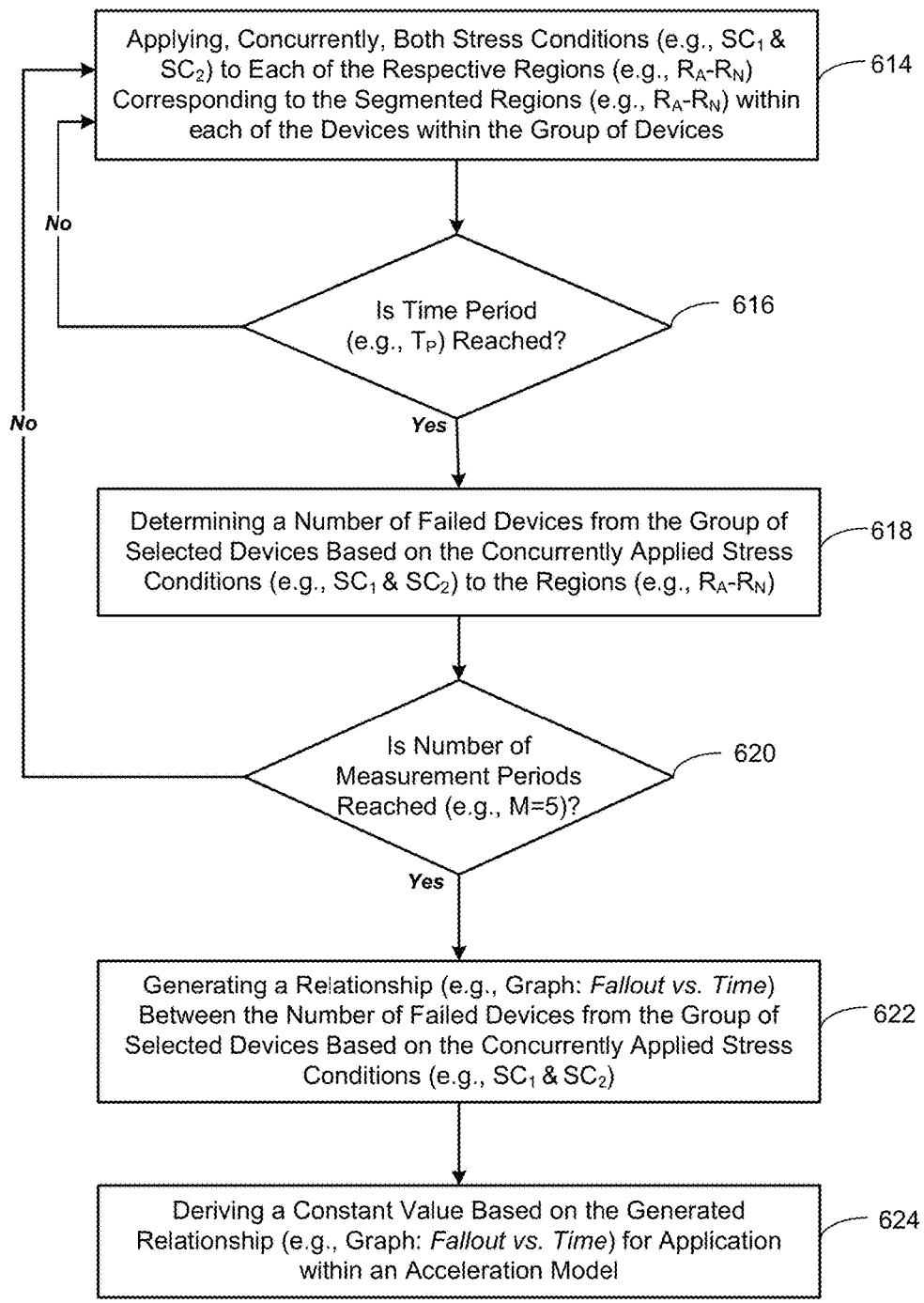

FIGS. 6A-6B depict a process flow diagram 600 for applying homogenized acceleration stress testing according to an embodiment. The process flow diagram 600 shown in FIGS. 6A-6B may also be described with the aid of FIGS. 2-4.

Referring to FIG. 6A, at 602 a group (e.g., 100 devices) of bonded, assembled, and tested (BAT) devices are selected for stress testing. At 604, each of the group of devices are partitioned or segmented into two or more regions based on having functional elements. For example, as depicted in FIG. 2, chip device 200 is segmented into two regions such as partitioned or segmented region 204 ($R_A$) and region 208 ($R_B$). Partitioned or segmented region 204 ($R_A$) may include one functional element (e.g., 100 Mb or SRAM memory) while partitioned or segmented region 208 ($R_B$) includes another functional element (e.g., 900 Mb or SRAM memory). Accordingly, each of the BAT group of devices may be partitioned in a similar manner. According to another example, as depicted in FIG. 3, chip device 300 is segmented into two regions such as partitioned or segmented region 304 ($R_A$) and region 308 ($R_B$). Partitioned or segmented region 304 ($R_A$) may include one functional element (e.g., one (1) core of a multi-core processor) while partitioned or segmented region 308 ($R_B$) includes another functional element (e.g., three (3) remaining cores of the multi-core processor). Accordingly, each of the BAT group of devices may be partitioned in a similar manner.

At 606, a first stress condition (e.g., a first stress temperature) is assigned for application to a first segmented or partitioned region within each of the group of devices. For example, as depicted in FIG. 2, a first higher stress temperature (e.g., 140° C.) may be assigned for application to partitioned or segmented region 204 ($R_A$) of chip device 200. At 608, a second stress condition (e.g., a second stress temperature) is assigned for application to at least one other segmented or partitioned region within each of the group of devices. For example, as depicted in FIG. 2, a second lower stress temperature (e.g., 100° C.) may be assigned for application to partitioned or segmented region 208 ($R_B$) of chip device 200.

According to yet another example, as depicted in FIG. 3, a first higher stress voltage (e.g., 2V) may be assigned for application to partitioned or segmented region 304 ($R_A$) of chip device 300 (process: 606). Similarly, a second lower stress voltage (e.g., 1V) may then be assigned for application to at least one other segmented or partitioned region such as partitioned or segmented region 308 ($R_B$) of chip device 300 (process: 608).

At 610, a time period ($T_p$) for application of the assigned stress conditions may be assigned or determined. For example, a $T_p$ value of 15-minutes may be assigned. According to yet another example, a $T_p$ value of 1-hour may be assigned. The assignment of a $T_p$ value may, among other things, be dependent on the stress conditions being applied and the sensitivity (e.g., fallout rate) of the devices under test to such stress conditions.

At 612, a number of measurement periods (M) for the application of the stress conditions may be assigned. For example, for M=5, five (5) fallout measurements are taken following each time period that the stress conditions are applied. More specifically, at M=1, fall out measurements are taken after the time period (e.g., $T_p$=15-minutes) passage (e.g., total passage of 15 minutes); at M=2, fall out measurements are taken after another time period (e.g., $T_p$=15-minutes) passage (e.g., total passage of 30 minutes); at M=3, fall out measurements are taken again after the time period (e.g., $T_p$=15-minutes) passage (e.g., total passage of 45 minutes); at M=4, fall out measurements are taken after the time period (e.g., $T_p$=15-minutes) passage (e.g., total passage of 60 minutes); and finally at M=5, fall out measurements are taken yet again after the time period (e.g., $T_p$=15-minutes) passage (e.g., total passage of 75 minutes). The application of the assigned time period and measurement period are further described below in relation to FIG. 6B.

Referring to FIG. 6B, at 614 the first assigned stress condition (e.g., a first stress temperature) is applied to the first segmented or partitioned region within each of the group of devices. For example, as depicted in FIG. 2, the first higher stress temperature (e.g., 140° C.) may be applied to partitioned or segmented region 204 ($R_A$) of chip device 200. According to yet another example, as depicted in FIG. 3, the first higher stress voltage (e.g., 2V) may be applied to partitioned or segmented region 304 ($R_A$) of chip device 300.

Further at 614, concurrently with the application of the first assigned stress condition (e.g., a first stress temperature), the second stress condition (e.g., a second stress temperature) is also applied to at least one other segmented or partitioned region within each of the group of devices. For example, as depicted in FIG. 2, the second lower stress temperature (e.g., 100° C.) may be applied to partitioned or segmented region 208 ($R_B$) of chip device 200. Similarly, according to another example, the second lower stress voltage (e.g., 1V) may be applied to at least one other segmented or partitioned region such as partitioned or segmented region 308 ($R_B$) of chip device 300.

At 616, it is determined whether the assigned time period $T_p$ has been reached. If the time period $T_p$ has not been reached, the process returns to 614, whereby the first and the second assigned stress conditions (e.g., a second stress temperature or voltage) continues to be applied to the respective first and second segmented or partitioned regions within each of the group of devices. Alternatively, if the time period $T_p$ has been reached, at 618 the number of failed devices (e.g., fallout percentage) from the group of selected BAT devices is determined based on the applied first and second assigned stress conditions.

At 620, following the determining of the number of failed devices (e.g., fallout percentage) from the group of selected BAT devices (618), it is determined whether the number of assigned measurement periods (e.g., M=5) has been reached. If the number of assigned measurement periods (e.g., M=5) has not been reached (e.g. M=1, 2, 3, or 4), processes 614-620 are repeated in the manner described.

If the number of assigned measurement periods (e.g., M=5) has been reached (e.g. M=5), at 622 a relationship such as the graph of Fallout vs. Time depicted in FIG. 4 may be generated based on the number of empirically determined failed devices subjected to the stress conditions. For example, as previously described, the time line (i.e., x-axis) for the determined number of device failures may be derived from the assigned time period ($T_p$) and measurement period (M).

At 624, using the empirically determined relationship between device failures and the applied stress conditions (e.g., temperature, voltage, etc.), a constant value may be determined for application within a designated acceleration model. Referring back to FIG. 4, one non-limiting example for determining a constant value for an acceleration model based on empirical fallout data was provided. Using the embodiment described herein, device failures are predominantly a factor of the assigned stress conditions that are applied and, therefore, have little to no dependency on wafer defect variability. Thus, the calculated constants used in the acceleration models are able to more accurately predict device failures based on assigned stress conditions.

Figure 7:
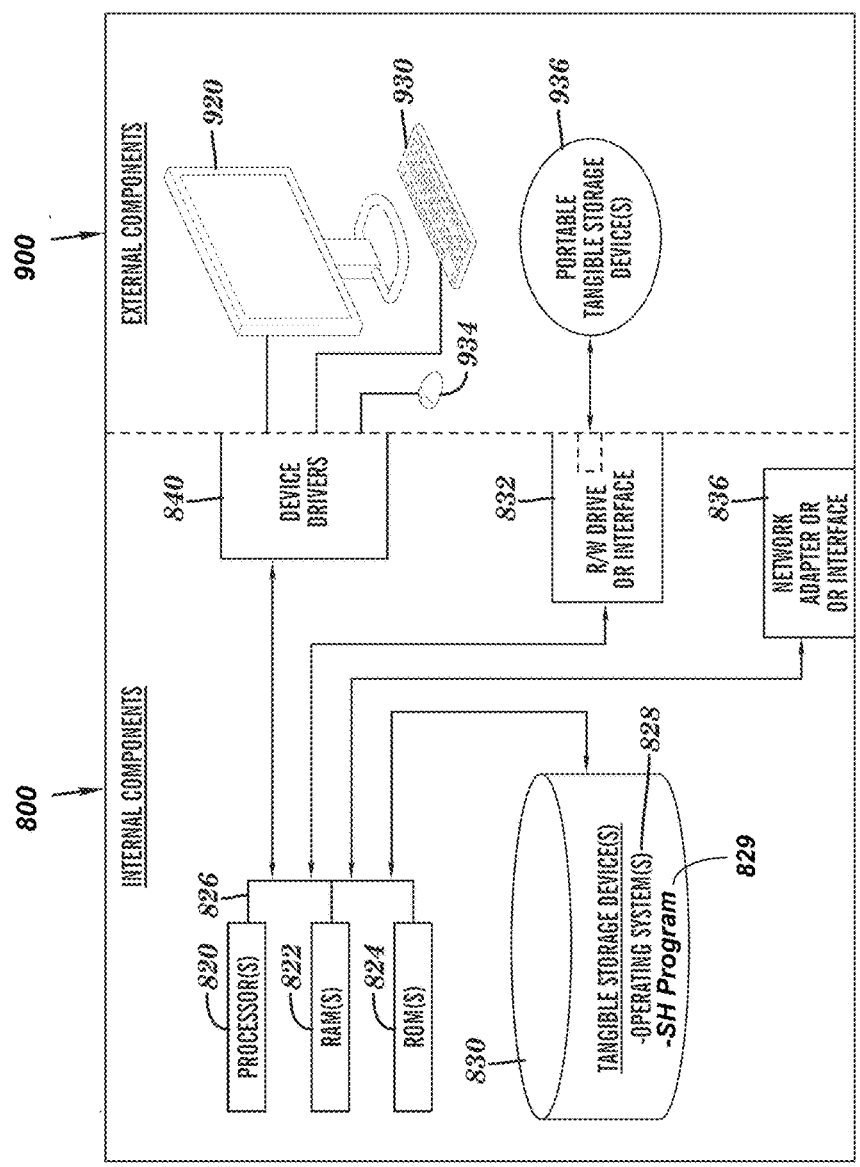
FIG. 7 is a block diagram of hardware and software for executing the process flows of FIGS. 5A-5C and/or FIGS. 6A-6B according to an embodiment.

FIG. 7 shows a block diagram of the components of a data processing system 800, 900, that may execute a Stress Homogenization (SH) program described by the processes of FIGS. 5A-5C and 6A-6B in accordance with an illustrative embodiment of the present invention. It should be appreciated that FIG. 7 provides only an illustration of one implementation and does not imply any limitations with regard to the environments in which different embodiments may be implemented. Many modifications to the depicted environments may be made based on design and implementation requirements.

Data processing system 800, 900 is representative of any electronic device capable of executing machine-readable program instructions. Data processing system 800, 900 may be representative of a smart phone, a computer system, PDA, or other electronic devices. Examples of computing systems, environments, and/or configurations that may represented by data processing system 800, 900 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

The data processing system 800, 900 may include internal component 800 and external component 900 illustrated in FIG. 7. Internal component 800 includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 and programs such as the SH program 829 is stored on one or more computer-readable tangible storage devices 830 for execution by one or more processors 820 via one or more RAMs 822 (which typically include cache memory). In the embodiment illustrated in FIG. 7, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Internal component 800 also includes a R/W drive or interface 832 to read from and write to one or more portable computer-readable tangible storage devices 936 such as a CD-ROM, DVD, memory stick, magnetic tape, magnetic disk, optical disk or semiconductor storage device. The SH program 829 can be stored on one or more of the respective portable computer-readable tangible storage devices 936, read via the respective R/W drive or interface 832 and loaded into the respective hard drive 830.

Internal component 800 may also include network adapters (or switch port cards) or interfaces 836 such as a TCP/IP adapter cards, wireless wi-fi interface cards, or 3G or 4G wireless interface cards or other wired or wireless communication links. SH program 829 can be downloaded from an external computer (e.g., server) via a network (for example, the Internet, a local area network or other, wide area network) and respective network adapters or interfaces 836. From the network adapters (or switch port adaptors) or interfaces 836, the SH program 829 is loaded into the respective hard drive 830. The network may comprise copper wires, optical fibers, wireless transmission, routers, firewalls, switches, gateway computers and/or edge servers.

External component 900 can include a computer display monitor 920, a keyboard 930, and a computer mouse 934. External component 900 can also include touch screens, virtual keyboards, touch pads, pointing devices, and other human interface devices. Internal component 800 also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

Aspects of the present invention have been described with respect to block diagrams and/or flowchart illustrations of methods, apparatus (system), and computer program products according to embodiments of the invention. It will be understood that each block of the flowchart illustrations and/or block diagrams, and combinations of blocks in the flowchart illustrations and/or block diagrams, can be implemented by computer instructions. These computer instructions may be provided to a processor of a general purpose computer, special purpose computer, or other programmable data processing apparatus to produce a machine, such that instructions, which execute via the processor of the computer or other programmable data processing apparatus, create means for implementing the functions/acts specified in the flowchart and/or block diagram block or blocks.

The aforementioned programs can be written in any combination of one or more programming languages, including low-level, high-level, object-oriented or non object-oriented languages, such as Java, Smalltalk, C, and C++. The program code may execute entirely on the user's computer, partly on the user's computer, as a stand-alone software package, partly on the user's computer and partly on a remote computer, or entirely on a remote computer or server. In the latter scenario, the remote computer may be connected to the user's computer through any type of network, including a local area network (LAN) or a wide area network (WAN), or the connection may be made to an external computer (for example, through the Internet using an Internet service provider). Alternatively, the functions of the aforementioned programs can be implemented in whole or in part by computer circuits and other hardware (not shown).

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A computer system for applying stress conditions to a chip device comprising an integrated circuit during accelerated stress testing, the computer system comprising:
   one or more computer processors, one or more computer-readable storage media, and program instructions stored on the one or more of the computer-readable storage media for execution by at least one of the one or more processors, the program instructions comprising:
   program instructions to partition the integrated circuit into a first region having a first functional element;
   program instructions to partition the integrated circuit into a second region having a second functional element;
   program instructions to apply a first stress condition to the first functional element until the first functional element is no longer operational;
   program instructions to apply a second stress condition to the second functional element until the second functional element is no longer operational;
   program instructions to measure a first time period between starting the program instructions to apply the first stress condition and when the first functional element is no longer operational;
   program instructions to measure a second time period between starting the program instructions to apply the second stress condition and when the second functional element is no longer operational; and
   program instructions to derive an acceleration model parameter based on the first stress condition and the corresponding first time period, and the second stress condition and the corresponding second time period.

2. The computer system of claim 1, wherein the program instructions to apply the first stress condition comprises program instructions to apply a first temperature controlled by a first on-chip heater, and wherein the program instructions to apply the second stress condition comprises program instructions to apply a second temperature controlled by a second on-chip heater.

3. The computer system of claim 1, further comprising:
   program instructions to partition the integrated circuit into a third region having a third functional element; and
   program instructions to apply a third stress condition to the third functional element until the third functional element is no longer operational.

4. The computer system of claim 1, wherein the program instructions to apply the first stress condition comprises program instructions to apply a first supply voltage controlled by a first on-chip voltage island, and wherein the program instructions to apply the second stress condition comprises program instructions to apply a second supply voltage controlled by a second on-chip voltage island, wherein the first functional element is electrically isolated from the second functional element.

5. The computer system of claim 1, wherein the first functional element comprises a first segment of a memory module, and the second functional element comprises a second segment of the memory module.

6. The computer system of claim 1, wherein the derived acceleration model parameter comprises an acceleration model constant for use in program instructions for an acceleration model that predicts device failures under different stress conditions over time.

7. The computer system of claim 1, wherein the program instructions to apply the first and the second stress conditions are applied concurrently, to the integrated circuit.

8. The computer system of claim 1, wherein the program instructions to apply the second stress condition to the integrated circuit follows the program instructions to apply the first stress condition.

9. The computer system of claim 1,
   wherein the first region having the first functional element comprises a first core of a multi-core processor; and
   wherein the second region having the second functional element comprises at least one other core of the multi-core processor.

10. A computer system for applying stress conditions to a chip device comprising an integrated circuit during accelerated stress testing, the computer system comprising:
    one or more computer processors, one or more computer-readable storage media, and program instructions stored on the one or more of the computer-readable storage media for execution by at least one of the one or more processors, the program instructions comprising:
program instructions to partition the integrated circuit into a first region having a first functional element;
program instructions to partition the integrated circuit into a second region having a second functional element;
program instructions to apply heat to the first functional element until the first functional element is no longer operational, wherein the program instructions to apply the heat to the first functional element comprises applying a first voltage across a first on-chip resistive element, the first on-chip resistive element is in direct thermal contact with the first functional element;
program instructions to apply heat to the second functional element until the second functional element is no longer operational, wherein the program instructions to apply the heat to the second functional element comprises applying a second voltage across a second on-chip resistive element, the second on-chip resistive element is in direct thermal contact with the second functional element, the first functional element is thermally isolated from the second functional element;
program instructions to measure a first time period between starting the program instructions to apply the first stress condition and when the first functional element is no longer operational;
program instructions to measure a second time period between starting the program instructions to apply the second stress condition and when the second functional element is no longer operational; and
program instructions to derive an acceleration model parameter based on the first stress condition and the corresponding first time period and the second stress condition and the corresponding second time period.

11. The computer system of claim 10, further comprising:
program instructions to partition the integrated circuit into a third region having a third functional element; and
program instructions to apply heat to the third functional element until the third functional element is no longer operational, wherein the program instructions to apply the heat to the third functional element comprises program instructions to apply a third voltage across a third on-chip resistive element, the third on-chip resistive element is in direct thermal contact with the third functional element, the third functional element is thermally isolated from both the first and second functional elements.

12. The computer system of claim 10, wherein the first functional element comprises a first segment of a memory module, and the second functional element comprises a second segment of the memory module.

13. The computer system of claim 10, wherein the program instructions to derive the acceleration model parameter comprises an acceleration model constant for use in an acceleration model that predicts device failures under different stress conditions over time.

14. The computer system of claim 10, wherein the program instructions to apply the first and the second stress conditions are simultaneously applied to the first and second functional elements.

15. The computer system of claim 10, wherein the first functional element comprises a first core of a multi-core processor, and the second functional element comprises at least one other core of the multi-core processor.

16. A computer system for applying stress conditions to a chip device comprising an integrated circuit during accelerated stress testing, the computer system comprising:
one or more computer processors, one or more computer-readable storage media, and program instructions stored on the one or more of the computer-readable storage media for execution by at least one of the one or more processors, the program instructions comprising:
program instructions to partition the integrated circuit into a first region having a first functional element;
program instructions to partition the integrated circuit into a second region having a second functional element;
program instructions to controllably provide a first voltage to the first functional element until the first functional element is no longer operational, wherein the integrated circuit comprises a first voltage control island for providing the first voltage to the first functional element;
program instructions to controllably provide a second voltage to the second functional element until the second functional element is no longer operational, wherein the integrated circuit comprises a second voltage control island for providing the second voltage to the second functional element, the first functional element is electrically isolated from the second functional element;
program instructions to measure a first time period between starting the application of the first stress condition and when the first functional element is no longer operational;
program instructions to measure a second time period between starting the application of the second stress condition and when the second functional element is no longer operational; and
program instructions to derive an acceleration model parameter based on the first stress condition and the corresponding first time period and the second stress condition and the corresponding second time period.

17. The computer system of claim 16, further comprising:
program instructions to partition the integrated circuit into a third region having a third functional element; and
program instructions to controllably provide a third voltage to the third functional element until the third functional element is no longer operational, wherein the integrated circuit comprises a third voltage control island for providing the third voltage to the third functional element, the third functional element is electrically isolated from the first and second functional elements.

18. The computer system of claim 16, wherein the first functional element comprises a first segment of a memory module, and the second functional element comprises a second segment of the memory module.

19. The computer system of claim 16, wherein the program instructions to apply the first and the second stress conditions are simultaneously applied to the first and second functional elements.

20. The computer system of claim 16, wherein the first functional element comprises a first core of a multi-core processor, and the second functional element comprises at least one other core of the multi-core processor.

* * * * *